US006713831B1

(12) United States Patent
Sadoughi et al.

(10) Patent No.: US 6,713,831 B1
(45) Date of Patent: Mar. 30, 2004

(54) BORDERLESS CONTACT ARCHITECTURE

(75) Inventors: Sharmin Sadoughi, Cupertino, CA (US); Mira Ben-Tzur, Sunnyvale, CA (US); Michal E. Fastow, Cupertino, CA (US); Saurabh Dutta Chowdhury, Belmont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 10 days.

(21) Appl. No.: 10/010,837

(22) Filed: Dec. 4, 2001

(51) Int. Cl.$^7$ .......................................... H01L 31/0232
(52) U.S. Cl. .................... 257/437; 257/436; 257/760
(58) Field of Search ............................... 257/431, 436, 257/437, 758, 760

(56) References Cited

U.S. PATENT DOCUMENTS

| 5,982,035 | A | * | 11/1999 | Tran et al. | 257/750 |
| 6,072,237 | A | * | 6/2000 | Jang et al. | 257/698 |
| 6,252,303 | B1 | * | 6/2001 | Huang | 257/758 |
| 6,340,844 | B1 | * | 1/2002 | Sakamori | 257/774 |
| 6,362,527 | B1 | * | 3/2002 | Mehta | 257/758 |
| 6,436,841 | B1 | * | 8/2002 | Tsai et al. | 438/738 |
| 6,455,435 | B1 | * | 9/2002 | Lehr et al. | 438/694 |
| 6,514,852 | B2 | * | 2/2003 | Usami | 438/624 |

* cited by examiner

Primary Examiner—Amir Zarabian
Assistant Examiner—Jamie L. Brophy
(74) Attorney, Agent, or Firm—Kevin J. Daffer; Conley Rose P.C.

(57) ABSTRACT

A method and a system are provided for forming a borderless contact structure. In particular, a method is provided which includes using an inorganic anti-reflective coating layer as an etch stop to form a borderless contact structure. In some embodiments, the method may include patterning an interconnect line above an inorganic layer with anti-reflective properties and depositing an upper interlevel dielectric layer above the interconnect line. A trench may then be etched within the upper interlevel dielectric layer such that a borderless contact structure may be formed in contact with said interconnect line. Consequently, a semiconductor topography is provided, in such an embodiment, which includes an inorganic anti-reflective coating layer arranged below an interconnect line and a contact structure arranged upon the interconnect line. In some embodiments, a width of the contact structure may be greater than a width of the interconnect line.

19 Claims, 5 Drawing Sheets

BORDERLESS CONTACT ARCHITECTURE

BACKGROUND OF THE INVENTION

1. Field of the Invention

This invention relates to semiconductor device manufacturing, and more particularly, to an improved method and device including the formation of a borderless contact structure.

2. Description of the Related Art

The following descriptions and examples are not admitted to be prior art by virtue of their inclusion within this section.

Fabrication of an integrated circuit involves numerous processing steps. For example, after implant regions (e.g., source/drain regions) have been placed within a semiconductor substrate and gate areas have been defined upon the substrate, alternating levels of interlevel dielectric and interconnect lines may be placed across the semiconductor topography to form a multi-level integrated circuit. Such a multi-level integrated circuit may include a plurality of layers and structures. For example, contact structures and/or vias may be formed within interlevel dielectric layers and in connection with interconnect lines. In some embodiments, the interlevel dielectric layers may include doped oxides. In particular, doped oxides may be used for forming self-aligned contact structures due to their etch selectivity to other materials. However, doped oxides typically need to be protected from the environment of the semiconductor fabrication process to prevent the formation of crystals within the doped oxide layer. As such, a semiconductor topography including a doped oxide interlevel dielectric typically includes a cap layer deposited thereon.

Forming various structures of an integrated circuit sometimes involves selectively removing portions of a material while other materials remain intact. In some cases, the formation of such structures involves patterning a photoresist upon the material. In such an embodiment, the photoresist may be patterned such that structures of particular dimensions may be fabricated. However, the use of a photoresist upon a layer or structure including a highly reflective material, such as metal, may cause problems. In particular, optical energy rays reflected off the upper surface of a metal layer may undesirably widen the pattern of the photoresist by exposing additional portions of the photoresist. In addition or alternatively, the reflected energy rays may produce standing waves within the photoresist during exposure and result in an undesirably ragged post-develop photoresist profile. Such pattern issues may be particularly prevalent in sub-micron technologies.

Furthermore, the use of a photoresist above a nonplanar topography may cause problems due to the different reflective characteristics of the underlying steps and structures. More specifically, correctly patterning layers upon a topological surface containing elevational "hill" or "valley" areas may be difficult using optical lithography since the all parts of the topography must be within the depth of focus of the lithography system. As such, the patterned image may be distorted and the intended structure may not be to the specifications of the device. Furthermore, the resolution of sub-micron (i.e., 1.0 micron or less) images may be particularly difficult, since the depth of focus required to pattern an upper surface of a semiconductor topography using a lithography tool of a particular wavelength may decrease with reductions in feature size.

To address these problems, an anti-reflective coating (ARC) may be formed beneath the photoresist to minimize the reflection of energy back toward the energy source during exposure of the photoresist. As such, a more accurate patterned photoresist profile may be formed. In addition, the ARC may planarize the topography such that the photoresist may be subsequently formed upon a planar surface. In this manner, lithography equipment may be used to a single depth of focus, thereby minimizing the distortions of the patterned image. Subsequent to the removal of the exposed portion of the underlying material, the ARC may be removed along with the photoresist such that additional layers and structures may be formed.

One example of a structure that may be formed within an integrated circuit is a borderless contact structure. A borderless contact structure may be referred to as a contact structure with a width greater than the width of the interconnect line over which it is formed. Such structures may also be referred to as "unlanded contacts" or "negative enclosure contacts". In order to form such a structure, a dielectric layer may be deposited upon an interconnect line and a trench with a width greater than the interconnect line may be etched within the dielectric layer to expose a portion of the interconnect line. The trench may be thereafter filled and planarized to form a borderless contact structure.

In some embodiments, the borderless contact structure may extend below the upper surface of the interconnect line. For example, the contact structure may extend along one or more sides of the interconnect line when the depth of the trench extends below the upper surface of the interconnect line. In some cases, the depth of the trench (and thus the borderless contact structure) may extend beyond the lower surface of the interconnect line into underlying portions of the semiconductor topography. Such an extension of a contact structure, generally referred to as punchthrough, may cause reliability issues and/or cause a device to be inoperable. As such, an etch stop layer may be formed above or below the interconnect line prior to formation of the trench such that the borderless contact structure does not extend into underlying portions of the semiconductor topography. Typically, such an etch stop layer includes silicon nitride since it adheres well to many materials and has good etch selectivity as compared to oxide. The use of such an etch stop layer, however, undesirably increases the process cycle time and fabrication costs of the device.

It would, therefore, be advantageous to develop a method for forming a borderless contact structure with fewer processing steps and layers.

SUMMARY OF THE INVENTION

The problems outlined above may be in large part addressed by a method for processing a semiconductor substrate. In particular, a method is provided which includes using an inorganic anti-reflective coating (IARC) layer as an etch stop to form a borderless contact structure. In some embodiments, the method may include patterning an interconnect line above an inorganic layer with anti-reflective properties and depositing an upper interlevel dielectric layer above the interconnect line. A trench may then be etched within the upper interlevel dielectric layer such that a borderless contact structure may be formed in contact with said interconnect line. Consequently, a semiconductor topography is provided, in this embodiment, which includes an IARC layer arranged below an interconnect line. Such a topography may further include a contact structure with a width greater than the width of the interconnect line and arranged upon the interconnect line.

As stated above, the method described herein may include using an IARC layer as an etch stop to form a borderless contact structure. The use of such an IARC layer may include depositing an interlevel dielectric layer above the IARC layer and etching a trench within the interlevel dielectric layer. The etching process may be terminated upon exposure of the IARC layer. The borderless contact structure may then be formed in contact with the interconnect line by filling the trench with a conductive material. In a preferred embodiment, the method may include using the IARC layer as a pattern layer for an underlying interlevel dielectric layer prior to using the IARC layer as an etch stop. More specifically, the method may include depositing the IARC layer upon the interlevel dielectric layer and depositing a photoresist layer upon the IARC layer. The method may further include patterning the photoreisist layer and IARC layer to expose portions of the interlevel dielectric layer. Alternatively, the photoresist layer may be patterned to exposed portions of the IARC layer. The exposed portions of the interlevel dielectric layer and/or IARC layer may then be etched to form a trench.

The materials used for the IARC layer may have properties that aid in producing a photoresist profile that meets the design specifications of the device. More specifically, the materials used for the IARC layer may have properties that aid in minimizing the reflection of energy back toward the energy source and minimizing standing waves within the photoresist layer. In general, the properties that influence how an ensuing energy ray may be transmitted through a material may include the material's refractive index and extinction coefficient. For example, the refractive index of a material may refer to the speed and angle at which an energy ray may transmit through the material. In this manner, it may be beneficial for the IARC layer to have approximately the same refractive index as an overlying resist layer in order to project the energy ray at a similar angle of incidence. The extinction coefficient of the material, on the other hand, may refer to the degree or amount by which the energy ray is lessened or "absorbed" as it traverses through the material. In other words, the extinction coefficient of a material may correspond to the amount by which the intensity of an energy ray may be reduced by traveling a given distance. The extinction coefficient may also be referred to as the absorption constant/coefficient, attenuation index, or damping constant. As such, the extinction coefficient of a material may affect the amount of light that may be scattered from the surface of the underlying topography back to the resist.

In general, the refractive index and extinction coefficient may be dependent on the wavelength of the energy used, and thus may be dependent upon each other. As such, a material including a refractive index and an extinction coefficient that together minimize the reflection of energy back toward the energy source and minimize standing waves produced within the photoresist is preferably used as the IARC layer. For example, the IARC layer may include a refractive index and an extinction coefficient between, but not including those of silicon dioxide and silicon nitride. In particular, the refractive index may be between approximately 1.6 and approximately 2.0 and the extinction coefficient may be between approximately 0.3 and approximately 0.9. Materials may include different values of refractive indexes and extinction coefficients, however, depending on the characteristics of the material and process parameters of the patterning process. Regardless of the process parameters of the etch process, examples of materials with the aforementioned properties may include silicon oxynitride or silicon rich oxide.

The method as described herein may include, in addition to using the IARC layer as an etch stop layer, using the IARC layer for other purposes within a semiconductor fabrication process. For example, the method may include using the IARC layer as a polish stop layer prior to using the inorganic anti-reflective coating layer as an etch stop. In such an embodiment, the method may include filling a trench with a conductive material. The conductive material may be planarized such that an upper surface of the conductive material is substantially planar with an upper surface of the IARC layer. In this manner, the polishing process may be terminated upon coming in contact with the IARC layer. In some embodiments, the method may include using the inorganic anti-reflective coating layer as a cap layer over an underlying interlevel dielectric layer. In such an embodiment, the interlevel dielectric layer may include doped oxide. In addition or alternatively, the method may include using the inorganic anti-reflective coating layer as a punchthrough stop to prevent the borderless contact structure from contacting the underlying dielectric layer.

In some embodiments, the method may include patterning an interconnect line above an inorganic layer including anti-reflective properties. In addition, the method may include depositing an upper interlevel dielectric layer above the interconnect line and etching a trench within the upper interlevel dielectric layer. A borderless contact structure may then be formed in contact with the interconnect line. In some embodiments, the method may include depositing a lower interlevel dielectric layer upon the semiconductor topography, below the inorganic layer and prior to patterning the interconnect line. A lower trench may be etched within the lower interlevel dielectric layer and a contact structure formed therein prior to patterning the interconnect line. In some embodiments, forming the lower contact structure may include lining the lower trench with a barrier layer. In a preferred embodiment, the method may include depositing the inorganic layer upon the lower interlevel dielectric layer and depositing a resist layer upon the inorganic layer prior to etching the lower trench. The inorganic layer and resist layer may then be patterned to expose portions of the topography to be etched. Alternatively, the resist layer may be patterned to expose portions of the inorganic layer. In either embodiment, the exposed portions of the interlevel dielectric layer and/or inorganic layer may be etched to form the trench. The resist layer may be removed either prior to forming the contact structure or prior to patterning the interconnect line.

Consequently, the method as described herein may form a semiconductor topography which includes an IARC layer arranged below an interconnect line and a contact structure arranged upon the interconnect line. Preferably, the IARC layer is in contact with the interconnect line. Moreover, the width of the contact structure is preferably greater than the width of the interconnect line. In some embodiments, the contact structure may contact an upper surface and one or more sides of the interconnect line. Alternatively, the contact structure may only contact the upper surface of the interconnect line. In either embodiment, the semiconductor topography may also include a lower interlevel dielectric layer arranged below the IARC layer as well as a second contact structure arranged within the lower interlevel dielectric layer. In some embodiments, the lower interlevel dielectric layer may include doped oxide. For example, the lower interlevel dielectric may include phosphorus silicate glass. Alternatively, the lower interlevel dielectric layer may include undoped oxide. Preferably, the IARC layer includes a refractive index and an extinction coefficient between, but not including those of silicon dioxide and silicon nitride. In particular, the refractive index may be between approximately 1.6 and approximately 2.0 and the extinction coefficient may be between approximately 0.3 and approximately 0.9. Materials may include different values of refractive indexes and extinction coefficients, however, depending on the characteristics of the material and process parameters of the patterning process. In either embodiment, the IARC layer may include silicon oxynitride or silicon rich oxide.

There may be several advantages to forming a borderless contact structure using the method as described herein. For example, such a method allows a borderless contact structure to be formed within a semiconductor topography without inducing punchthrough. In addition, the method does not require the deposition of a separate etch stop layer for the formation of the borderless contact structure. Moreover, an additional cap layer is not needed when a material underlying the borderless contact structure includes a doped oxide. The reduction in the number of such layers reduces the process time of the fabrication process, thereby saving time and money.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
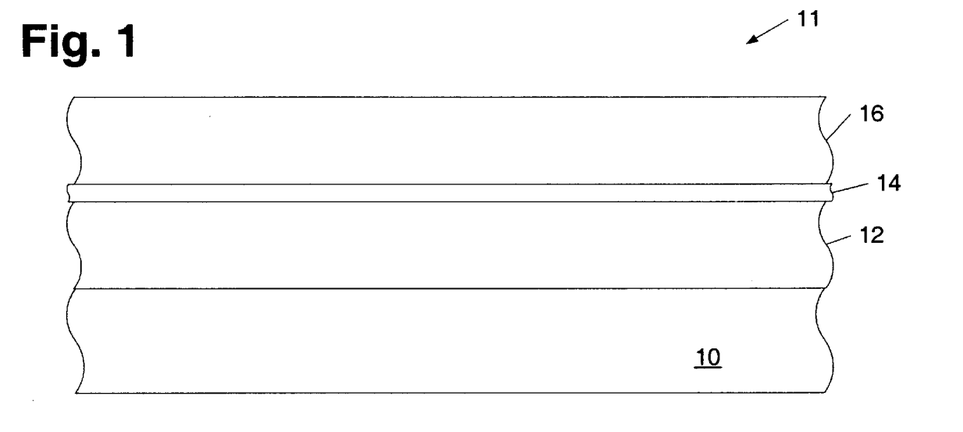
FIG. 1 depicts a partial cross sectional view of a semiconductor topography including lower dielectric layer, an IARC layer, and a photoresist layer formed upon a semiconductor substrate.

Turning to the drawings, an exemplary embodiment of a method for processing a semiconductor layer is shown in FIGS. 1–13. FIG. 1 depicts semiconductor topography 11 in which lower dielectric 12 is formed upon semiconductor layer 10. Moreover, inorganic anti-retlective coating (IARC) layer 14 may be formed above the upper surface of lower dielectric 12 and resist 16 may be formed above IARC layer 14. In a preferred embodiment, IARC layer 14 may be formed upon and in contact with the upper surface of lower dielectric 12 as shown in FIG. 1. In addition or alternatively, resist 16 may be formed, in some embodiments, upon and in contact with IARC layer 14. Semiconductor layer 10 may be a semiconductor substrate such as a silicon substrate, and may be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, semiconductor layer 10 may include structures and layers formed upon a semiconductor substrate, such as a monocrystalline silicon semiconductor substrate. The structures and layers may include, but are not limited to, gate dielectric layers, gate structures, contact structures, local interconnect wires, additional dielectric layers, or metallization layers. In this manner, semiconductor layer 10 may be substantially planar or may have substantial elevational differences due to the formation of such structures and layers.

As shown in FIG. 1, lower dielectric 12 may be formed upon an upper surface of semiconductor layer 10. In some embodiments, lower dielectric 12 may be an interlevel dielectric. FIG. 1 illustrates semiconductor layer 10 as being substantially planar, so a conformal deposit of lower dielectric 12 may yield a substantially planar upper surface. Alternatively, lower dielectric 12 may be formed upon a lower semiconductor layer having a plurality of nonplanar structures formed upon and spaced across the semiconductor topography. In such an embodiment, lower dielectric 12 may be planarized to form a substantially planar upper surface. Alternatively, the upper surface of lower dielectric 12 may remain substantially non-planar. The thickness of lower dielectric 12 may be between approximately 6,000 angstroms and approximately 10,000 angstroms. Larger or smaller thicknesses of lower dielectric 12, however, may be appropriate depending on the semiconductor device being formed.

Lower dielectric 12 may include any of various dielectric materials used in semiconductor fabrication. For example, lower dielectric 12 may include silicon dioxide (SiO$_2$), tetraethylorthosilicate glass (TEOS) based silicon dioxide, silicon nitride (Si$_x$N$_y$), silicon dioxide/silicon nitride/silicon dioxide (ONO), silicon carbide, or carbonated polymers. Alternatively, lower dielectric 12 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In some cases, lower dielectric 12 may also be undoped. Alternatively, lower dielectric 12 may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight.

IARC layer 14 may be formed above lower dielectric 12. In some cases, IARC layer 14 may be formed upon and in contact with lower dielectric 12 as shown in FIG. 1. ARC layer 14 preferably includes an inorganic material with anti-reflective properties. More specifically, IARC layer 14 preferably includes an inorganic material with properties that may aid in producing a profile within overlying resist 16 that meets the design specifications of the device. In other words, the materials used for the IARC layer may have properties that aid in minimizing the reflection of energy back toward an energy source and minimizing standing waves within overlying resist 16 during patterning of the resist layer. Properties that influence how an ensuing energy ray may be transmitted through a material may include the material's refractive index and extinction coefficient. In general, the refractive index and extinction coefficient may be dependent on the wavelength of the energy used, and thus may be dependent upon each other. As such, a material including a refractive index and an extinction coefficient that together minimize the reflection of energy back toward the energy source and minimize standing waves produced within the overlying photoresist is preferably used as the IARC layer. In addition, the refractive index and extinction coefficient of a material may depend on the characteristics of the material itself. For example, the thickness and/or composition of a material may affect the refractive index and extinction coefficient of a material. Moreover, as will be explained below, the thickness and/or composition of a material may affect the photolithographic effects and etch selectivity of the IARC layer.

In general, the refractive index may refer to the ratio of the speed of light in a vacuum as compared to the speed of light in a medium. Alternatively said, the refractive index of a material may relate to the speed at which an energy ray may transmit through the material. In addition, the speed of such an energy ray may relate to the angle at which the energy ray is refracted through the material. For example, as an energy ray is transmitted through differing materials, the energy ray may bend with respect to the refractive index of the ensuing material, altering the speed at which the energy ray is transmitted. As such, the refractive index of a material may affect the angle at which an energy ray is projected through materials. Therefore, it may be beneficial for IARC layer 14 to have approximately the same refractive index as overlying resist 16 in order to project the energy ray at a similar angle of incidence.

The extinction coefficient of a material, on the other hand, may refer to the degree or amount by which an energy ray is lessened or "absorbed" as it traverses through the material. In other words, the extinction coefficient of a material may correspond to the amount by which the intensity of an energy ray may be reduced by traveling a given distance. As such, the extinction coefficient of a material may affect the amount of light that may be transmitted to an underlying topography. Likewise, the extinction coefficient of a material may affect the amount of light that may be scattered from the surface of the underlying topography back to the resist. The extinction coefficient may also be referred to as the absorption constant/coefficient, attenuation index, or damping constant.

Since a refractive index and extinction coefficient of a layer depends on the characteristics of the layer and the wavelength to which it is exposed, the refractive index and extinction coefficient of IARC layer 14 may not be strictly defined within a numerical range of each parameter. Rather, the refractive index and extinction coefficient of IARC layer 14 may be defined as compared to materials with which IARC layer 14 may be similar. For example, IARC layer 14 preferably includes a refractive index and an extinction coefficient between, but not including those of silicon dioxide and silicon nitride. Materials with such properties may include, for example, silicon oxynitride and silicon rich silicon oxide. In this manner, IARC layer 14 may not include silicon dioxide or silicon nitride, but rather may include those materials that include a refractive index and an extinction coefficient with values between the refractive indexes and extinction coefficients of silicon dioxide and silicon nitride. In such an embodiment, IARC layer 14 may include a similar thickness to those layers of silicon dioxide and silicon nitride used to define IARC layer 14's refractive index and extinction coefficient. In addition, a similar wavelength may be referred to such that the values of the refractive indexes and extinction coefficients for each of the materials may be related. In an exemplary embodiment, IARC layer 14 may include a refractive index between approximately 1.6 and approximately 2.0 and an extinction coefficient between approximately 0.3 and approximately 0.9. However, IARC layer 14 may include other ranges of refractive indexes and extinction coefficients depending on the characteristics of the layer and wavelength used to expose the layer during the patterning process.

The thickness of IARC layer 14 may be between approximately 400 angstroms and approximately 3,000 angstroms. Larger or smaller thicknesses of IARC layer 14, however, may be appropriate depending on the semiconductor device being formed. In particular, the thickness of IARC layer 14 may be tailored for optimum photolithography effects. For example, the thickness of IARC layer 14 may be based upon the energy level of the patterning source and planarity of the underlying topography. In this manner, the thickness of IARC layer 14 may be optimized to minimize the amount of energy reflected back to the source and simultaneously planarize the topography such that the depth of focus across the topography may be substantially the same. In addition or alternatively, the thickness of IARC layer 14 may be optimized based on its etch selectivity as compared to a subsequently formed upper dielectric layer. The formation of such a layer is illustrated and described in FIG. 9 below. In a preferred embodiment, the thickness and composition of IARC layer 14 is preferably chosen such that it may serve as an adequate patterning aid for resist 16 and an etch stop layer for the subsequent removal of an upper dielectric layer.

In addition to the thickness of IARC layer 14, the composition of IARC layer 14 may affect the photolithographic effects and etch selectivity of the IARC layer. For example, in an embodiment in which IARC layer 14 includes silicon oxynitride, the amount of nitrogen within the material may contribute to influencing the photolithographic effects and etch selectivity of the material. Likewise, in an embodiment in which IARC layer 14 includes silicon rich silicon oxide, the amount of silicon within the material may contribute to influencing its respective photolithographic effects and etch selectivity. In general, the etch selectivity of a material (i.e., as compared to silicon oxide) may increase with an increase of nitrogen and/or silicon content. On the contrary, the image resolution of patterned profiles within the resist may decrease as the concentration of nitrogen and/or silicon increases within a material. As such, the amount of nitrogen or silicon within IARC layer 14 may be optimized to meet these two conflicting requirements. In some embodiments, such an optimization may favor photolithography requirements over etch selectivity. Alternatively, the optimization of etch selectivity may be favored over photolithography requirements.

Figure 2:
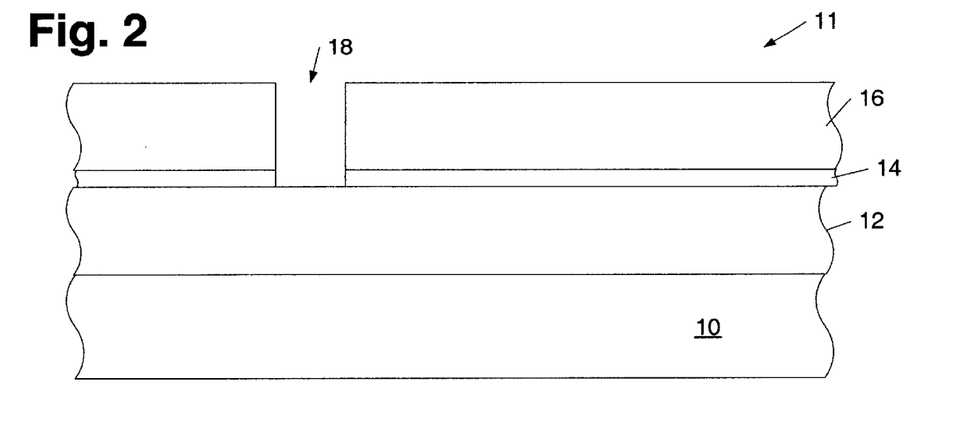
FIG. 2 depicts a partial cross sectional view of the semiconductor topography in which an opening is formed within the IARC layer and photoresist layer of FIG. 1.
Figure 3:
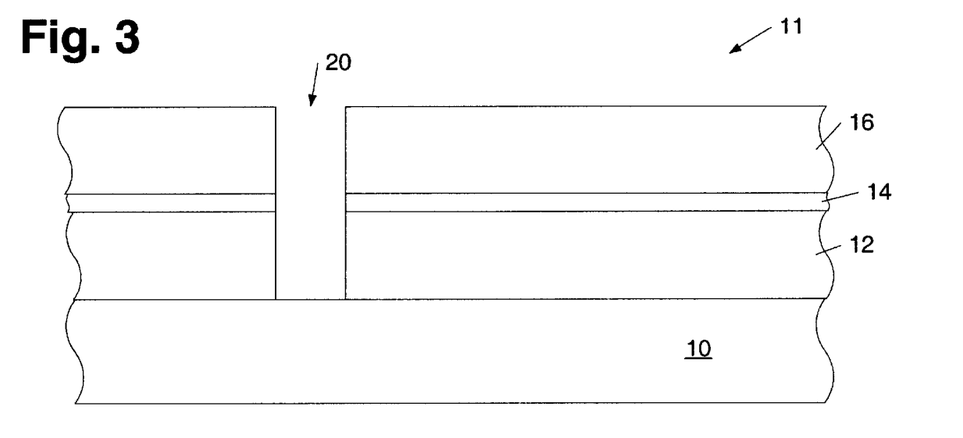
FIG. 3 depicts a partial cross sectional view of the semiconductor topography in which a trench is formed within the lower dielectric layer subsequent to the opening formation of FIG. 2.

In an embodiment, resist 16 may be formed upon IARC layer 14. Resist 16 may include a photoresist, such as a deep ultraviolet resist, an I-line resist, a G-line resist, or another resist, such as an e-beam resist or an x-ray resist. As stated above, resist 16 preferably includes a material with a similar refractive index as IARC layer 14. Resist 16 and IARC layer 14 may be patterned using a lithography technique to form opening 18 as shown in FIG. 2. The presence of IARC layer 14 beneath resist 16 may advantageously minimize the amount of energy reflected back up by the underlying topography, thereby minimizing the formation of standing waves within resist 16. Consequently, opening 18 may include a profile that meets the design specifications of the device. After patterning opening 18 within resist 16 and IARC layer 14, the exposed portion of lower dielectric 12 may be etched to form trench 20 as shown in FIG. 3. The etch process may include wet etch and/or dry etch techniques. Although FIGS. 2 and 3 illustrate the formation of a single opening and therefore a single trench, any number of openings and trenches may be formed across semiconductor topography 11 in accordance with design specifications of the device. In addition, the trenches may be formed with various widths and depths in accordance with the design specifications of the device.

Figure 4:
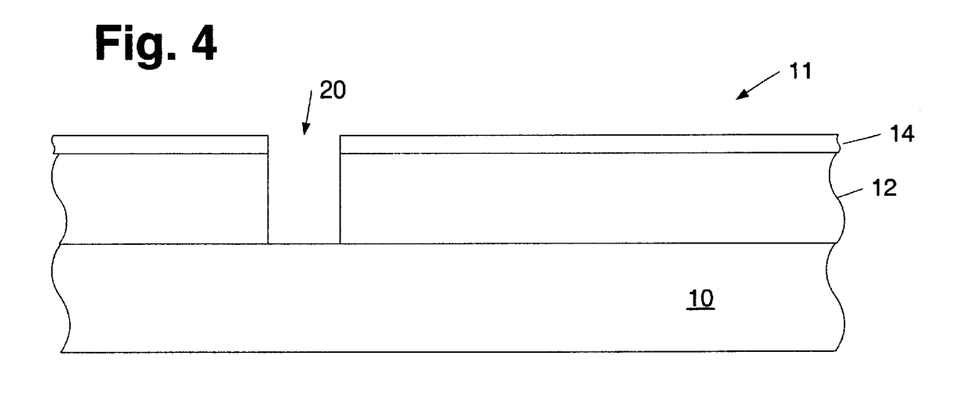
FIG. 4 depicts a partial cross sectional view of the semiconductor topography in which the photoresist layer is removed subsequent to the trench formation of FIG. 3.

The patterned resist 16 may then be removed as shown in FIG. 4. Such a removal may be by a stripping process such as a wet etch or a reactive ion etch stripping process. Preferably, IARC layer 14 is not removed during such a removal process. In this manner, IARC layer 14 may be subsequently used as an etch stop layer for the formation of a borderless contact structure. In such an embodiment, IARC layer 14 may also be used as a punchthrough stop layer to prevent the subsequently formed borderless contact structure from contacting lower dielectric 12. The formation of such a borderless contact structure is illustrated and described in FIG. 11 below. Furthermore, IARC layer 14 may be used as a cap layer for lower dielectric 12. The use of IARC layer 14 as such a cap layer may be particularly useful when lower dielectric layer 12 includes doped oxide since doped oxides typically need to be protected from the environment of the semiconductor fabrication process. In addition or alternatively, IARC layer 14 may be used as a polish stop layer for the formation of a contact structure within trench 20. Such a contact structure may be used to couple to impurity regions within semiconductor layer 10 or electrically link interconnect lines arranged within semiconductor layer 10 and subsequently formed overlying layers.

Figure 5:
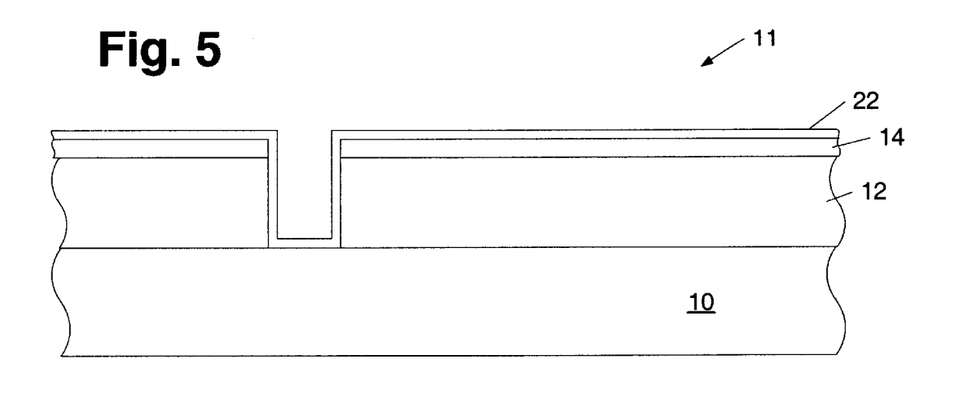
FIG. 5 depicts a partial cross sectional view of the semiconductor topography in which a barrier layer is formed within trench subsequent to the removal of the photoresist layer in FIG. 4.

As shown in FIG. 5, the fabrication of a contact structure within trench 20 may begin with the deposition of barrier layer 22 along the bottom surface and sidewalls of trench 20. In addition, barrier layer 22 may be deposited upon the upper surfaces of IARC layer 14 adjacent to trench 20. Barrier layer 22 may serve as a lining for the contact structure subsequently formed within trench 20. In some embodiments, barrier layer 22 may aid in the adhesion of the contact structure to semiconductor layer 10. In addition or alternatively, barrier layer 22 may act as a diffusion layer. Such a layer may prevent the impurities in semiconductor layer 10 from diffusing into the subsequently formed contact structure. Barrier layer 22 may include titanium, titanium nitride, or a combination of such materials. In addition, barrier layer 22 may have a thickness, for example, between approximately 50 angstroms to approximately 250 angstroms. However, smaller and larger thicknesses may be used depending on the design specifications of the device. In an alternative embodiment, barrier layer 22 may be omitted. In this manner, the method as described herein may exclude the processing step of FIG. 5 and continue to FIG. 6 after the removal of resist 16 in FIG. 4.

Figure 6:
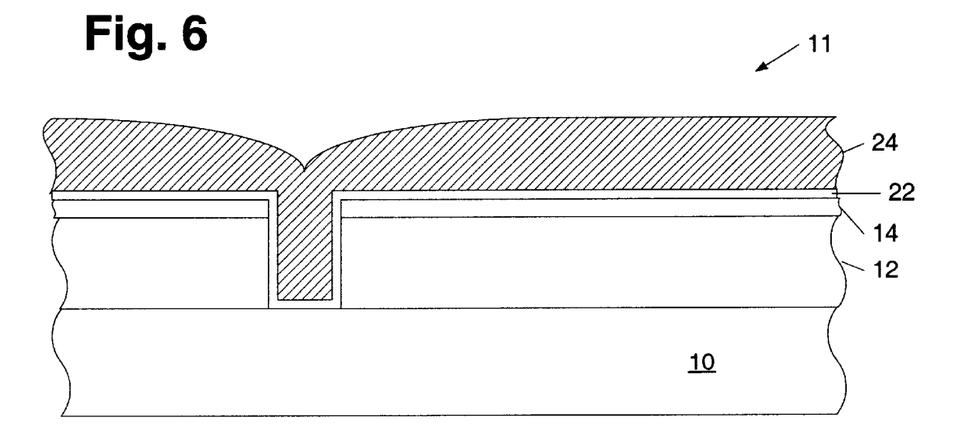
FIG. 6 depicts a partial cross sectional view of the semiconductor topography in which a conductive material is deposited within the trench subsequent to the barrier layer formation of FIG. 5.
Figure 7:
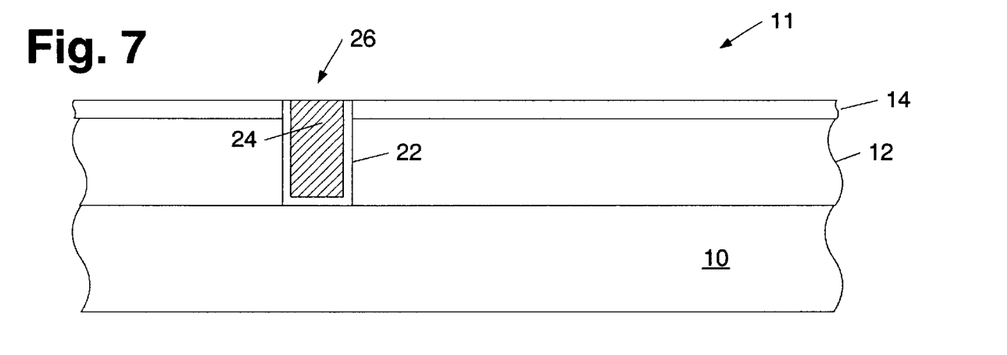
FIG. 7 depicts a partial cross sectional view of the semiconductor topography in which the conductive material is polished subsequent to the deposition of conductive material in FIG. 6.
Figure 8:
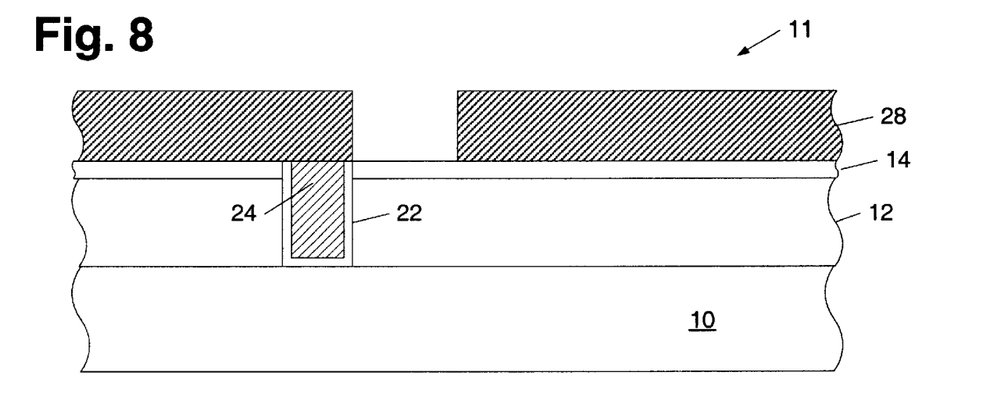
FIG. 8 depicts a partial cross sectional view of the semiconductor topography in which an interconnect line is formed upon the upper surface of the topography subsequent to polishing the conductive material in FIG. 7.

FIG. 6 illustrates the deposition of conductive layer 24 upon barrier layer 22. As such, conductive layer 24 may be deposited within trench 20 and above portions of IARC layer 14 adjacent to trench 20. Conductive layer 24 may include a conductive material, such as polysilicon, aluminum, copper, titanium, or a metal alloy. Subsequently, the semiconductor topography may be planarized as shown in FIG. 7 such that the portions of conductive layer 24 and barrier layer 22 above the upper surface of trench 20 are removed. In other words, conductive layer 24 and barrier layer 22 may be removed such that the upper surfaces of IARC layer 14 may be exposed. The planarization of the two layers may form contact structure 26 bounded by lower dielectric 12 and IARC layer 14. Interconnect line 28 may then be patterned upon the upper surface of semiconductor topography 11 as shown in FIG. 8. Interconnect line 28 may include a conductive material, such as aluminum, copper, titanium, tungsten, titanium nitride, or a metal alloy. Interconnect line 28 may be patterned to a variety of widths and lengths depending on the design specifications of the device.

In an alternative embodiment (not shown), contact structure 26 and interconnect line 28 may be formed simultaneously. In such an embodiment, conductive layer 24 may be deposited to a thickness above trench 20. The topography may then be planarized and patterned to form a metallization line including interconnect line 28 and contact structure 26. In this manner, contact structure 26 and interconnect line 28 may include the same material. In an embodiment in which barrier layer 22 is previously deposited within trench 20 and upon the upper surfaces of IARC layer 14, barrier layer 22 may be planarized before the deposition of conductive layer 24. In this manner, the upper surface of barrier layer 22 may be coplanar with the upper surface of IARC layer 14.

Figure 9:
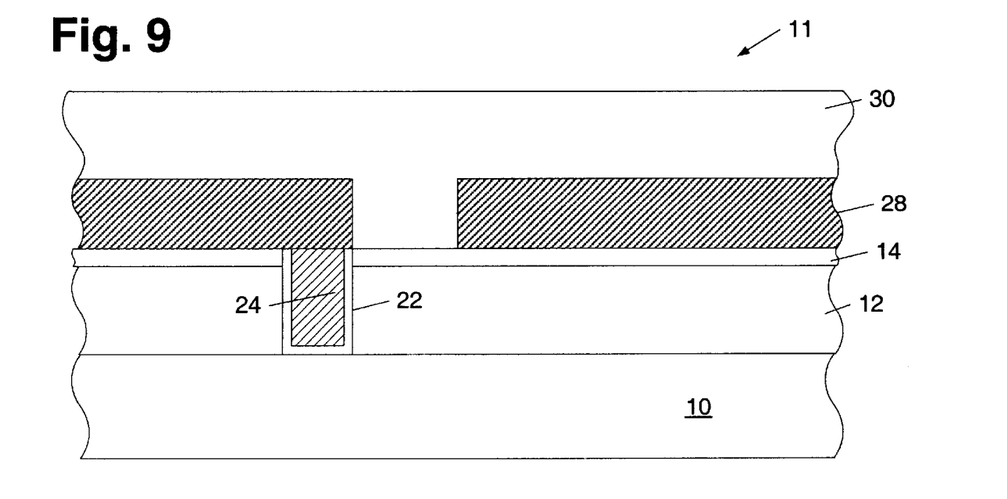
FIG. 9 depicts a partial cross sectional view of the semiconductor topography in which an upper dielectric layer is formed upon the upper surface of the topography subsequent to the interconnect line formation of FIG. 8.

FIG. 9 illustrates the deposition of upper dielectric 30 upon interconnect line 28 and exposed portions of IARC layer 14. As with dielectric 12, upper dielectric 30 may include various dielectric materials used in semiconductor fabrication. As such, upper dielectric 30 may include silicon dioxide, TEOS based silicon dioxide, silicon nitride, silicon dioxide/silicon nitride/silicon dioxide, silicon carbide, or carbonated polymers. Alternatively, upper dielectric 30 may be formed from a low-permittivity ("low-k") dielectric, such as fluorine-doped silicon dioxide. Upper dielectric 30 may also be undoped or may be doped to form, for example, low doped borophosphorus silicate glass (BPSG), low doped phosphorus silicate glass (PSG), or fluorinated silicate glass (FSG). In some embodiments, upper dielectric 30 may include the same material as lower dielectric 12. Alternatively, upper dielectric 30 may include a different material than lower dielectric 12. For example, upper dielectric 30 may include undoped oxide and lower dielectric 12 may include a doped oxide layer.

Figure 10:
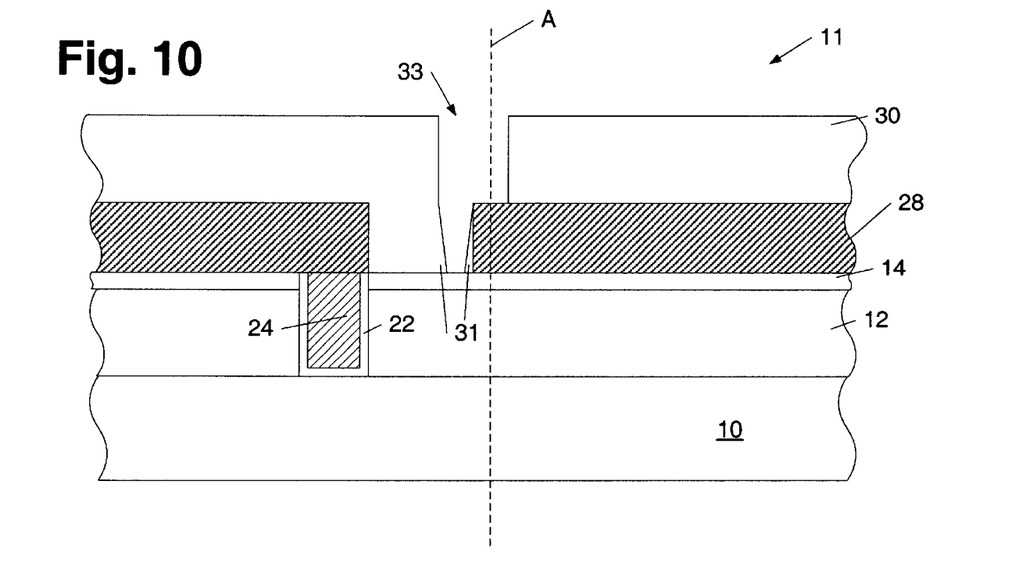
FIG. 10 depicts a partial cross sectional view of the semiconductor topography in which a trench is formed within the upper dielectric layer subsequent to the upper dielectric formation of FIG. 9.
Figure 11:
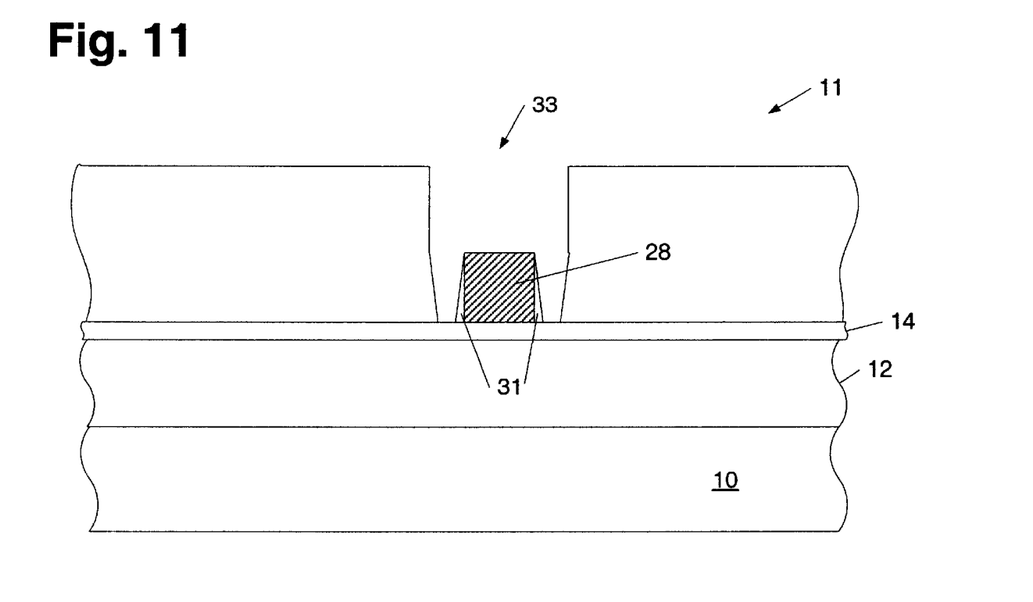
FIG. 11 depicts a different partial cross sectional view of the semiconductor topography in FIG. 10.

Upper dielectric 30 may be etched to form trench 33. Such a formation may be conducted by using wet or dry etch techniques. In some embodiments, trench 33 may be formed at the end of interconnect line 28 as shown in FIG. 10. In an alternative embodiment, trench 33 may be arranged along a different portion of interconnect line 28 such that trench 33 does not extend to the end of interconnect line 28. In either embodiment, trench 33 may be used to form a borderless contact structure. As such, the width of trench 33 may be greater than the width of interconnect line 28. Consequently, the depth of trench 33 may vary. FIG. 10 illustrates a partial cross-sectional view of the formation of borderless contact structure 36 along the length of interconnect line 28. Therefore, the portions of trench 33 extending beyond the width of interconnect line 28 are not shown. Such portions, however, are illustrated in FIG. 11 in which a partial cross-sectional view of trench 33 along the width of interconnect line 28 at line A is shown.

In general, one or more portions of trench 33 may extend below the upper surface of interconnect line 28. Alternatively stated, one or more bottom portions of trench 33 may extend to IARC layer 14. For example, FIG. 11 illustrates the peripheral portions of trench 33 extending below the upper surface of interconnect line 28. In this manner, trench 33 may "straddle" interconnect line 28 such that portions of trench 33 are on either side of interconnect line 28. In an alternative embodiment, trench 33 may be shift and/or the width of trench 33 may be reduced such that one sidewall of trench 33 does not extend beyond the upper surface of interconnect line 28. In such an embodiment, the portion of trench 33 opposite from the sidewall may, however, extend below the upper surface of interconnect line 28 since the width of trench 33 is preferably greater than the width of interconnect line 28 in order for a borderless contact structure to be subsequently formed. In some eases, other portions of trench 33 may extend to IARC layer 14. For example, since trench 33 is formed at the end of interconnect line 28, another portion of trench 33 may extend below the upper surface of interconnect line 28 as shown in FIG. 10.

In a preferred embodiment, at least a portion of trench 33 only extends to the upper surface of interconnect line 28 such that a borderless contact structure may be formed within trench 33 and in contact with the upper surface of interconnect line 28. Since the portions of trench 33 extending to IARC layer 14 are considerably deeper than the portions extending to the upper surface of interconnect line 28, the etch profile of the trench in the deeper region may be tapered as shown by tapered portions 31. Such a tapered profile may be due to the use of dry etch techniques. Alternatively, the etch process may form substantially vertical sidewalls within the region of trench 33 extending to IARC layer 14 and thus, semiconductor topography 11 may not include tapered portions 31. In either embodiment, IARC layer 14 preferably serves as an etch stop layer for the etch process used to form trench 33. More specifically, IARC layer 14 may serve to prevent the undesirable etching of lower dielectric 12. In this manner, IARC layer 14 may serve as a punchthrough stop layer to prevent punchthrough of the subsequently formed contact structure to lower dielectric 12.

Figure 12:
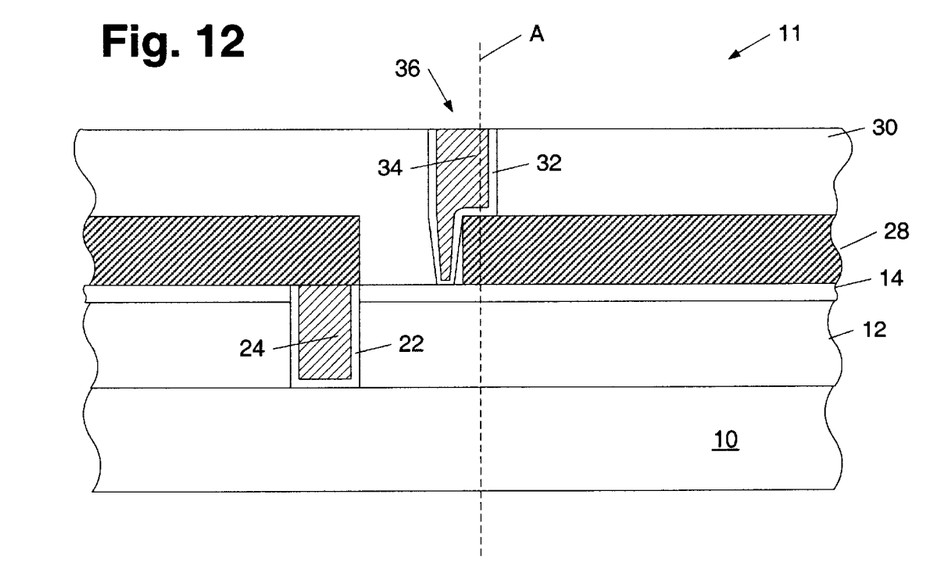
FIG. 12 depicts a partial cross sectional view of the semiconductor topography in which a borderless contact structure is formed within the trench of the upper dielectric layer subsequent to the trench formation of FIG. 10.

Borderless contact structure 36 may be formed within trench 33 as shown in FIG. 12. The formation of such a borderless contact structure may be similar to the process of forming contact structure 26 in FIGS. 5–7. As such, barrier layer 32 may be formed within trench 33 and upon the upper surfaces of upper dielectric 30. In addition, conductive layer 34 may be deposited and subsequently planarized such that the upper surface of borderless contact structure 36 is coplanar with the upper surfaces of upper dielectric 30. Such a planarization step may include the planarization of barrier layer 32. Alternatively, barrier layer 32 may be planarized directly after its deposition. In some embodiments, barrier layer 32 may be omitted from the topography such that conductive layer 34 may be formed in contact with interconnect line 28 and IARC layer 14. Barrier layer 32 and conductive layer 34 may have similar compositions to those of barrier layer 22 and conductive layer 24, respectively. As such, barrier layer 32 may include titanium, titanium nitride, or a combination of such materials. Conductive layer 34, on the other hand, may include polysilicon, aluminum, copper, titanium, or a metal alloy.

Figure 13:
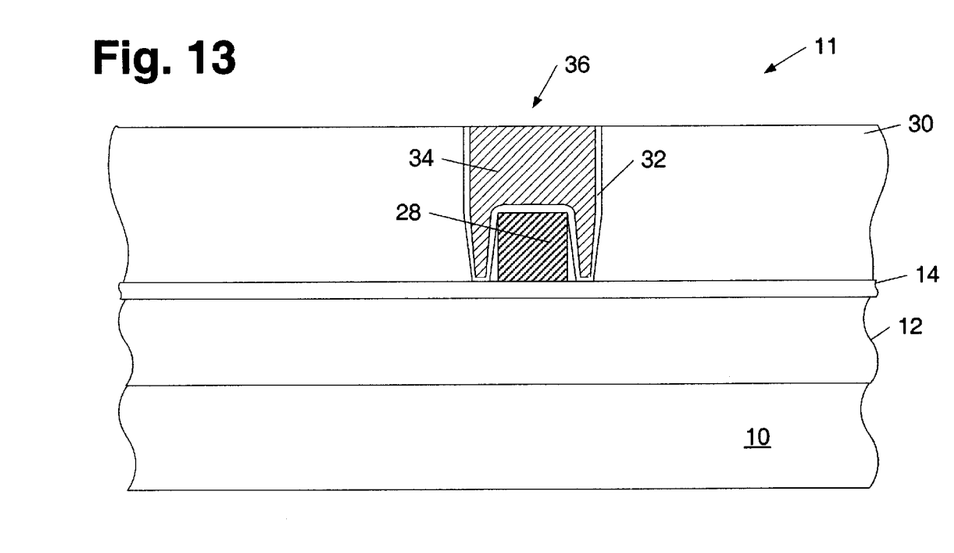
FIG. 13 depicts a partial cross sectional view of the semiconductor topography in FIG. 12 along the direction of the view of FIG. 11.

FIG. 13 illustrates the formation of borderless contact structure 36 in the partial cross-sectional view taken from FIG. 12. As such, FIG. 13 illustrates borderless contact structure 36 arranged along the width of interconnect line 28 at line A with portions of borderless contact structure 36 extending to the upper surfaces of IARC layer 14. In some embodiments, the arrangement of borderless contact structure 36 may be shifted and/or reduced such that only one side of the borderless contact structure 36 extends to the upper surface of IARC layer. In such an embodiment, the opposite lateral surface of contact structure 36 may be formed upon the upper surface of interconnect line 28. In either embodiment, such a borderless contact structure may advantageously lower the contact resistance between the borderless contact structure and the underlying interconnect line. More specifically, the increased surface area between interconnect line 28 and borderless contact structure 36 may reduce the contact resistance between the two components.

It will be appreciated to those skilled in the art having the benefit of this disclosure that this invention is believed to provide a method and a system for forming a borderless contact structure. Further modifications and alternative embodiments of various aspects of the invention will be apparent to those skilled in the art in view of this description. For example, the architecture as described herein may be formed within any layer of a semiconductor device. It is intended that the following claims be interpreted to embrace all such modifications and changes and, accordingly, the drawings and the specification are to be regarded in an illustrative rather than a restrictive sense.

What is claimed is:

1. A semiconductor topography, comprising:
   an inorganic anti-reflective coating layer having an uppermost surface arranged below and in contact with a lowermost surface of an interconnect line; and
   a contact structure having an upper portion arranged upon the interconneet line and a lower portion arranged upon the uppermost surface of the inorganic anti-reflective coating layer, wherein a width of the contact structure is greater than a width of the interconnect line.

2. The semiconductor topography of claim 1, wherein the contact structure contacts an upper surface and one or more sides of the interconnect line.

3. The semiconductor topography of claim 1, further comprising a lower interlevel dielectric layer arranged below the inorganic anti-reflective coating layer.

4. The semiconductor topography of claim 3, further comprising a second contact structure arranged within a trench formed within the lower interlevel dielectric layer and having an upper surface, which is coplanar with the uppermost surface of the inorganic anti-reflective coating layer.

5. The semiconductor topography of claim 3, wherein the lower interlevel dielectric layer comprises doped oxide.

6. The semiconductor topography of claim 5, wherein the doped oxide comprises phosphorus silicate glass.

7. The semiconductor topography of claim 1, wherein the inorganic anti-reflective coating layer comprises a refractive index between, but not including, refractive indexes of silicon dioxide and silicon nitride, respectively.

8. The semiconductor topography of claim 1, wherein the inorganic anti-reflective coating layer comprises a refractive index between approximately 1.6 and approximately 2.0.

9. The semiconductor topography of claim 1, wherein the inorganic anti-reflective coating layer comprises an extinction coefficient between, but not including, extinction coefficients of silicon dioxide and silicon nitride, respectively.

10. The semiconductor topography of claim 1, wherein the inorganic anti-reflective coating layer comprises an extinction coefficient between approximately 0.3 and approximately 0.9.

11. The semiconductor topography of claim 1, wherein the inorganic anti-reflective coating layer comprises silicon oxynitride.

12. The semiconductor topography of claim 4, wherein the inorganic anti-reflective coating layer is configured as a punchthrough stop layer to prevent the contact structure from contacting the lower interlevel dielectric layer.

13. The semiconductor topography of claim 4, wherein the inorganic anti-reflective coating layer is configured as a pattern layer to form the trench within the lower interlevel dielectric layer.

14. The semiconductor topography of claim 4, wherein the inorganic anti-reflective coating layer is configured as a polish stop layer to form the coplanar upper surface of the second contact structure.

15. A semiconductor topography, comprising:
   an inorganic anti-reflective coating layer having an uppermost surface arranged below and in contact with a lowermost surface of an interconnect line;
   a lower interlevel dielectric layer arranged below and in contact with a lowermost surface of the inorganic anti-reflective coating layer, wherein the lower interlevel dielectric layer comprises a doped oxide; and
   a contact structure having an upper portion arranged upon the interconnect line and a lower portion arranged upon the uppermost surface of the inorganic anti-retlective coating layer, wherein a width of the contact structure is greater than a width of the interconnect line.

16. The semiconductor topography of claim 15, wherein the inorganic anti-reflective coating layer is configured as a cap layer to protect the lower interlevel dielectric layer.

17. The semiconductor topography of claim 15, further comprising an upper dielectric layer arranged upon the interconnect line and a portion of the inorganic anti-reflective coating layer, wherein the contact structure is arranged within a trench formed within the upper dielectric layer.

18. The semiconductor topography of claim 17, wherein the inorganic anti-reflective coating layer is configured as an etch stop layer to prevent the trench from entering the lower interlevel dielectric layer.

19. The semiconductor topography of claim 15, wherein the inorganic anti-reflective coating layer comprises a refractive index between approximately 1.6 and approximately 2.0.

* * * * *

UNITED STATES PATENT AND TRADEMARK OFFICE
CERTIFICATE OF CORRECTION

PATENT NO. : 6,713,831 B1
DATED : March 30, 2004
INVENTOR(S) : Sadoughi et al.

It is certified that error appears in the above-identified patent and that said Letters Patent is hereby corrected as shown below:

Column 12,
Line 56, please delete "interconneet" and substitute therefor -- interconnect --.

Column 13,
Line 26, please delete "claim 4" and substitute therefor -- claim 3 --.

Column 14,
Line 14, please delete "anti-retlective" and substitute therefor -- anti-reflective --.

Signed and Sealed this

Thirty-first Day of August, 2004

JON W. DUDAS
*Director of the United States Patent and Trademark Office*